United States Patent [19]
Ueda et al.

[11] Patent Number: 6,084,255
[45] Date of Patent: Jul. 4, 2000

[54] GATE ARRAY SEMICONDUCTOR DEVICE

[75] Inventors: Kimio Ueda; Takanori Hirota; Yoshiki Wada; Koichiro Mashiko, all of Tokyo, Japan

[73] Assignee: Mitsubishi Denki Kabushiki Kaisha, Tokyo, Japan

[21] Appl. No.: 09/126,092

[22] Filed: Jul. 30, 1998

[30] Foreign Application Priority Data

Jan. 29, 1998 [JP] Japan ................................. 10-017014

[51] Int. Cl.$^7$ ............................................. H01L 27/10
[52] U.S. Cl. ......................... 257/204; 257/206; 257/351
[58] Field of Search ................................... 257/204, 206, 257/351

[56] References Cited

U.S. PATENT DOCUMENTS

| | | | |
|---|---|---|---|
| 5,001,528 | 3/1991 | Bahraman . | |
| 5,633,524 | 5/1997 | Ueda et al. | 257/369 |
| 5,793,068 | 8/1998 | Mahant-Shetti . | |
| 6,008,510 | 12/1999 | Kumagai | 257/204 |

OTHER PUBLICATIONS

Takakuni Douseki, et al. "A 0.5V SIMOX–MTCMOS Circuit with 200ps Logic Gate", ISSCC96/Session 5/Technology Directions: High Speed, Low–Power/Paper TP 5.4, pp 84–85, and 423.

Tsuneaki Fuse, et al. "0.5V SOI CMOS Pass–Gate Logic", ISSCC96/Session 5/Technology Directions: High Speed, Low–Power/Paper TP 5.6, pp 88–89, and 424.

Tsuneaki Fuse, et al., "A 0.5V 200MHz 1–Stage 32b ALU Using a Body Bias Controlled SOI Pass–Gate Logic", 1997 IEEE International Solid–State Circuits Conference, SA 17.1 pp 286–287, and 472.

Primary Examiner—Gene M. Munson
Attorney, Agent, or Firm—Oblon, Spivak, McClelland, Maier & Neustadt, P.C.

[57] ABSTRACT

In each of basic cells (BC) arranged in array in an SOI layer, PMOS and NMOS transistors are symmetrically formed. Body regions (11) and (12) are formed to divide source/drain layers (1) and (2), respectively, and gate electrodes (3) and (4) are formed on the body regions (11) and (12) respectively to sandwich gate insulating films therebetween. The gate electrodes (3) and (4) are connected at their both ends to gate contact regions (5) to (8), respectively, and the body regions (11) and (12) are connected at their one ends to body contact regions (9) and (10), respectively. The body contact regions (9) and (10) are so arranged as to sandwich the gate contact regions (5) and (7) together with the gate electrodes (3) and (4), respectively. Being of a SOI type, the device achieves high-speed operation and low power consumption. Further, with positional relation between the body contact regions (9), (10) and the gate contact regions (5), (7), the device is capable of freely setting the transistors to be of either a gate control type or a gate fixed type. As a result, the gate array type semiconductor device achieves high-speed operation and low power consumption.

12 Claims, 15 Drawing Sheets

GATE ARRAY SEMICONDUCTOR DEVICE

BACKGROUND OF THE INVENTION

1. Field of the Invention

The present invention relates to a gate array type semiconductor device with MOS transistors arranged in array on a semiconductor layer.

2. Background of the Invention

The gate array type semiconductor device has been in wide use as a technique for providing an LSI in a short development period of time. This gate array type semiconductor device is previously formed halfway toward completion through a step (called a master step) of forming a semiconductor region and a gate electrode which form each of the MOS transistors (usually a pair of PMOS and NMOS transistors) arranged in array.

Each element or MOS transistor, which may be a pair of PMOS and NMOS transistors, at this stage is called a basic cell. Then, through a step (called a slice step) of forming a contact hole or a via hole and then a wiring pattern on each basic cell according to the user's order, the semiconductor device is made as a customized LSI. The components such as the contact hole or the wiring pattern formed on each basic cell through the slice step is called a macro cell.

In this fashion, the semiconductor device is previously prepared halfway toward completion through the master step common in various LSI manufacturing. This allows the gate array technique to manufacture various customized LSIs in a shorter development period of time as compared with a full-customizing technique wherein every step is executed according to the user's order.

By the way, attention is now focused on the fact that the MOS transistor formed on the semiconductor layer (SOI (Semiconductor on Insulator) layer) stacked on the surface of a buried insulating layer (generally consisting of oxide) has smaller parasitic capacitance than the MOS transistor formed on a semiconductor substrate of a bulk, thereby achieving high-speed operation and low power consumption.

Further, attention is also given to a recently introduced body control type SOI-CMOS circuit with a gate electrode connected to a body electrode, for achieving high-speed operation even at an extremely low voltage, for example, 0.5 V (c.L "1996 IEEE International Solid-State Circuit Conference" pp. 84–85, pp. 88–89, "1997 IEEE International Solid-State Circuit Conference" pp. 286–287). This transistor and circuit are, however, only the semiconductor devices manufactured by the full-customizing technique (a full-customized semiconductor device), so that the achievement of various kinds of LSIs will require quite a long development period of time.

SUMMARY OF THE INVENTION

A first aspect of the present invention is directed to a semiconductor device of gate array type, comprising: an insulating layer of electrical insulation; and a semiconductor layer formed on the insulating layer and defining a major surface on an opposite side of the insulating layer, the device defining cell regions arranged in a row along the major surface, the semiconductor layer, in each one of the cell regions, having: a source/drain region of first conductivity type exposed to the major surface; a body region of second conductivity type exposed to the major surface and so arranged as to divide the source/drain region into two regions which are placed side by side in a direction of the row; and a body contact region of second conductivity type exposed to the major surface and linked to an end of the body region, the device, in each one of the cell regions, further comprising: a gate insulating film of electrical insulation formed on a portion of the major surface to which the body region is exposed; a gate electrode of electrical conductance formed on the gate insulating film; and gate contact regions of electrical conductance formed on the gate insulating film and respectively linked to both ends of the gate electrode, and the body contact region being disposed at such a position that the same and the gate electrode sandwich one of the gate contact regions therebetween.

A second aspect of the present invention is directed to the semiconductor device according to the first aspect of the present invention, wherein the semiconductor layer further has: an isolation insulating film which isolates the body contact region from each other between any adjacent two of the cell regions.

A third aspect of the present invention is directed to the semiconductor device according to the second aspect of the present invention, wherein the device, in each one of at least a part of the cell regions, further comprises: a connecting wiring which electrically connects the body contact region and the one of the gate contact regions with each other.

A fourth aspect of the present invention is directed to the gate array type semiconductor device according to the third aspect of the present invention, wherein the device further comprises: a source wiring for supplying a source potential, the cell regions include another part thereof excluding the at least a part thereof, and the device, in each one of the another part of the cell regions, further comprises: another connecting wiring which electrically connects the body contact region and the source wiring with each other.

A fifth aspect of the present invention is directed to the semiconductor device according to the first aspect of the present invention, wherein the source/drain region is integrally contiguous with each other between any adjacent two of the cell regions.

A sixth aspect of the present invention is directed to the semiconductor device according to the fifth aspect of the present invention, wherein the device further comprises: a source wiring for supplying a source potential, and the device, in each one of at least a part of the cell regions, further comprises: a connecting wiring which electrically connects the source wiring, the body contact region and the one of the gate contact regions with one another.

A seventh aspect of the present invention is directed to the semiconductor device according to the first aspect of the present invention, wherein the semiconductor layer, in each one of the cell regions, further has: another body contact region of second conductivity type exposed to the major surface and linked to another end of the body region, and the another body contact region is disposed at such a position that the same and the gate electrode sandwich another one of the gate contact regions therebetween.

An eighth aspect of the present invention is directed to the semiconductor device according to the first aspect of the present invention, wherein the device, in each one of at least a part of the cell regions, further comprises: a connecting wiring lower in electric resistance than the gate electrode, the connecting wiring being disposed over the gate electrode and electrically connecting the gate contact regions with each other which are respectively linked to the both ends of the gate electrode.

A ninth aspect of the present invention is directed to the semiconductor device according to the first aspect of the present invention, wherein the body region is narrower in a direction of the row in any portion thereof right under the gate electrode and the gate contact regions than the body contact region.

A tenth aspect of the present invention is directed to a semiconductor device of gate array type, comprising: an insulating layer of electrical insulation; and a semiconductor layer formed on the insulating layer and defining a major surface on an opposite side of the insulating layer, the semiconductor layer having: a source/drain region of first conductivity type exposed to the major surface; a body region of second conductivity type exposed to the major surface and so arranged as to divide the source/drain region into two regions; and a body contact region of second conductivity type exposed to the major surface and linked to an end of the body region, the device further comprising: a gate insulating film of electrical insulation formed on a portion of the major surface to which the body region is exposed; a gate electrode of electrical conductance formed on the gate insulating film; and gate contact regions of electrical conductance formed on the gate insulating film and respectively linked to both ends of the gate electrode, the body contact region being disposed at such a position that the same and the gate electrode sandwich one of the gate contact regions therebetween, and the body region being narrower in a direction perpendicular to a row formed by the gate electrode, the one of the gate contact regions, and the body contact region in any portion thereof right under the gate electrode and the gate contact regions than the body contact region.

Since the semiconductor device according to the first aspect is of the gate array type and the SOI type, through the slice step using this device as a base, various kinds of integrated circuits with high-speed operation and low power consumption can be achieved in a short development period of time. Especially, the gate contact region between the body contact region and the gate electrode allows the body contact region to be connected to the gate contact region or the source wiring, or the both, through the connecting wire in the slice step.

In the device according to the second aspect, since the body contact regions in the adjacent cell regions are isolated from each other by the isolation insulating film, a circuit comprising the body control type MOS transistor can be achieved by electrically connecting the body contact region and the gate contact region.

In the device according to the third aspect, the body contact region and the gate contact region are connected to each other at least in part of the cell regions. This achieves a circuit comprising the body control type MOS transistor with high-speed operation.

The device according to the fourth aspect achieves a circuit comprising both the body control type MOS transistors and the body fixed type MOS transistors, thereby saving power consumption without deteriorating high-speed operation.

In the device according to the fifth aspect, the source/drain regions in the adjacent cell regions are integrally contiguous to each other. Further, the source wiring, the body contact region, and the gate contact region can be connected to one another in the slice step. Thus, the gate isolation in part of the cell regions can be implemented, which thereby achieves a highly-integrated circuit.

In the device according to the sixth aspect, at least in part of the cell region, the source wiring, the body contact region, and the gate contact region are electrically connected to one another through the connecting wire. Thus, a highly-integrated circuit with circuit components isolated by the gate isolation from each other is implemented.

In the device according to the seventh aspect, the body region is linked at its both ends to the body contact regions. Thus, by connecting the body region and the gate electrodes at their both ends respectively through the body contact regions, electrical resistance of the body region can be reduced, which thereby improves the operating speed of the MOS transistor.

In the device according to the eighth aspect, the both ends of the gate electrode are connected through the connecting wire which is lower in electrical resistance than the gate electrode. As a result, the electrical resistance of the gate electrode is substantially reduced, which thereby achieves a circuit including the MOS transistor with high-speed operation.

In the device according to the ninth aspect, since larger in width than the body region, the body contact region can be easily connected to the connecting wire. Further, since the body region is smaller in width than the body contact region even right under the gate contact region, there is no need to widely form the gate contact region in consideration of a margin. This reduces a gap in the arrangement of the cell regions and improves integration of the circuit.

In the device according to the tenth aspect, since larger in width than the body region, the body contact region can be easily connected to the connecting wire. Further, since the body region is smaller in width then the body contact region even right under the gate contact region, there is not need to widely form the gate contact region in consideration of a margin. This reduces the area of the MOS transistor in the semiconductor layer.

Thus, an object of the present invention is to provide the gate array type semiconductor device achieving high-speed operation and low power consumption and reducing the development period of time, and especially to provide the semiconductor device achieving the circuit comprising the body control type MOS transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

First, a semiconductor device according to a first preferred embodiment will be described.

1-1. Device After the Completion of Master step

Figure 1:
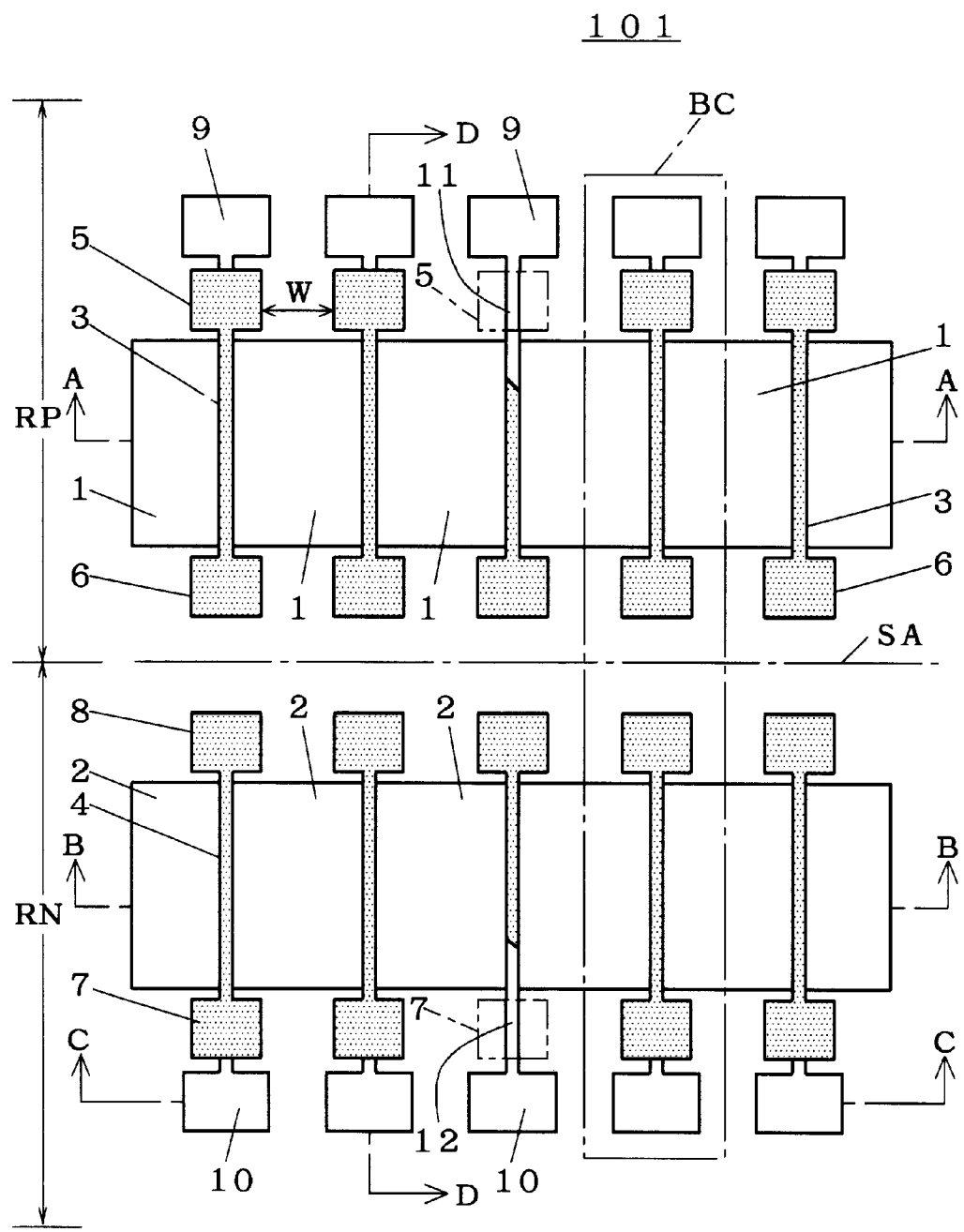
FIG. 1 is a plan view showing a device after the completion of a master step according to a first preferred embodiment.
Figure 2:
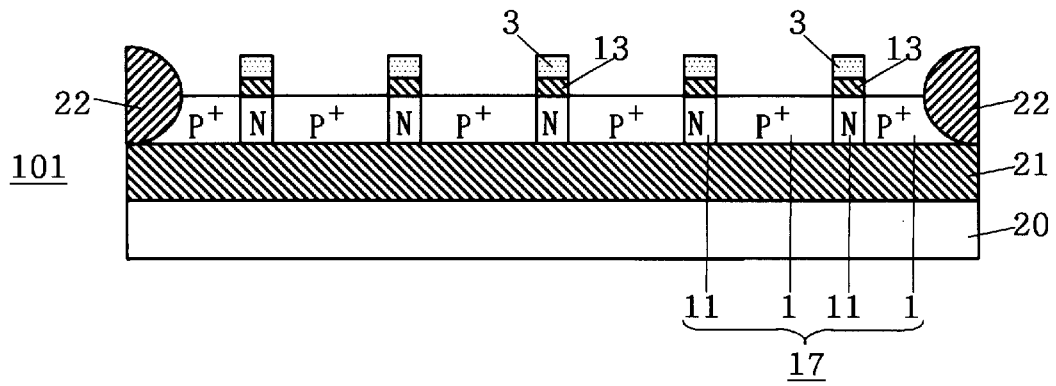
FIG. 2 is a sectional view taken along a broken line A—A in FIG. 1.
Figure 3:
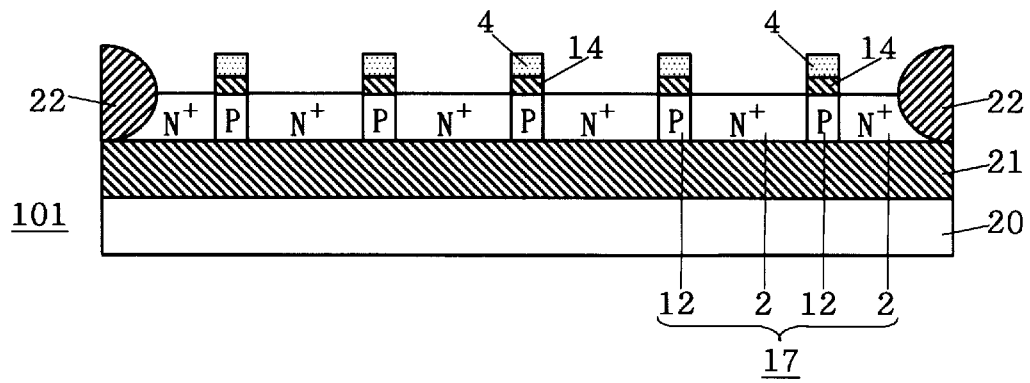
FIG. 3 is a sectional view taken along a broken line B—B in FIG. 1.

FIG. 1 is a plan view of a semiconductor device according to the first preferred embodiment. FIGS. 2 to 5 are sectional views taken along broken lines A—A, B—B, C—C, and D—D, respectively. A device 101 is constituted as a gate array type semiconductor device, corresponding to the semiconductor device formed halfway toward completion through the master step.

Referring to FIGS. 1 to 5, in the device 101, an insulating layer 21 is formed on a semiconductor substrate 20, and then an SOI layer 17 is formed thereon. Namely, the device 101 is constituted as an SOI type semiconductor device. The semiconductor substrate 20 is, for example, a silicon substrate. Further, for example, the insulating layer 21 is constituted as a silicon oxide layer (called a buried oxide film), and the SOI layer 17 is constituted as a silicon layer.

In the SOI layer 17, along its major surface, a PMOS region RP and an NMOS region RN are symmetrically formed on both sides of a symmetric axis SA, respectively. The PMOS region RP is where a PMOS transistor is formed, while the NMOS region RN is where an NMOS transistor is formed. Namely, the device 101 is constituted suitable for a circuit consisting of CMOS transistors.

Respective components of the PMOS and NMOS regions RP and RN are symmetrical in conductivity types and further in positions and shapes, with reference to the symmetric axis SA. In the PMOS region RP, a source/drain region 1 of a $P^+$ conductivity type, a body region 11 of an N conductivity type, and a body contact region 9 of an $N^+$ conductivity type are formed. The source/drain region 1 is exposed at its upper surface to the upper major surface of the SOI layer 17, and at its bottom surface reaches the upper major surface of the insulating layer 21.

A plurality of body regions 11 are selectively formed to divide the source/drain region 1. The body regions 11 are arranged along the symmetric axis SA in stripes in parallel with each other at regular intervals, extending orthogonal to the symmetric axis SA. The body regions 11 are exposed at them upper surface to the upper major surface of the SOI layer 17, and at its bottom surface reaches the upper major surface of the insulating layer 21. Namely, the body regions 11 divide the source/drain region 1 so that the divided source/drain regions 1 will not be integrally linked to each other in either the horizontal direction along its major surface or the vertical direction to its major surface.

On the exposed surface of the body region 11, a gate insulating film 13 is formed, and then a gate electrode 3 is provided thereon. Namely, the gate electrode 3 is opposed to the exposed surface of the body region 11, with the gate insulating film 13 sandwiched therebetween. The gate electrode 3 is further linked at its both ends to gate contact regions 5 and 6. Like the gate electrode 3, the gate contact regions 5 and 6 are also arranged on the gate insulating film 13 which is formed on the upper major surface of the SOI layer 17. Being electrode regions for connecting the gate electrode 3 and a wiring pattern which will be described later, the gate contact regions 5 and 6 are formed larger in width along the symmetric axis SA than the gate electrode 3.

Right under the gate contact region 5, part of the body region 11 juts out of the source/drain region 1. At one end of the body region 11, a body contact region 9 is selectively formed. Like the body region 11, the body contact region 9 is also exposed at its upper surface to the upper major surface of the SOI layer 17, and at its bottom surface reaches the upper major surface of the insulating layer 21.

Figure 5:
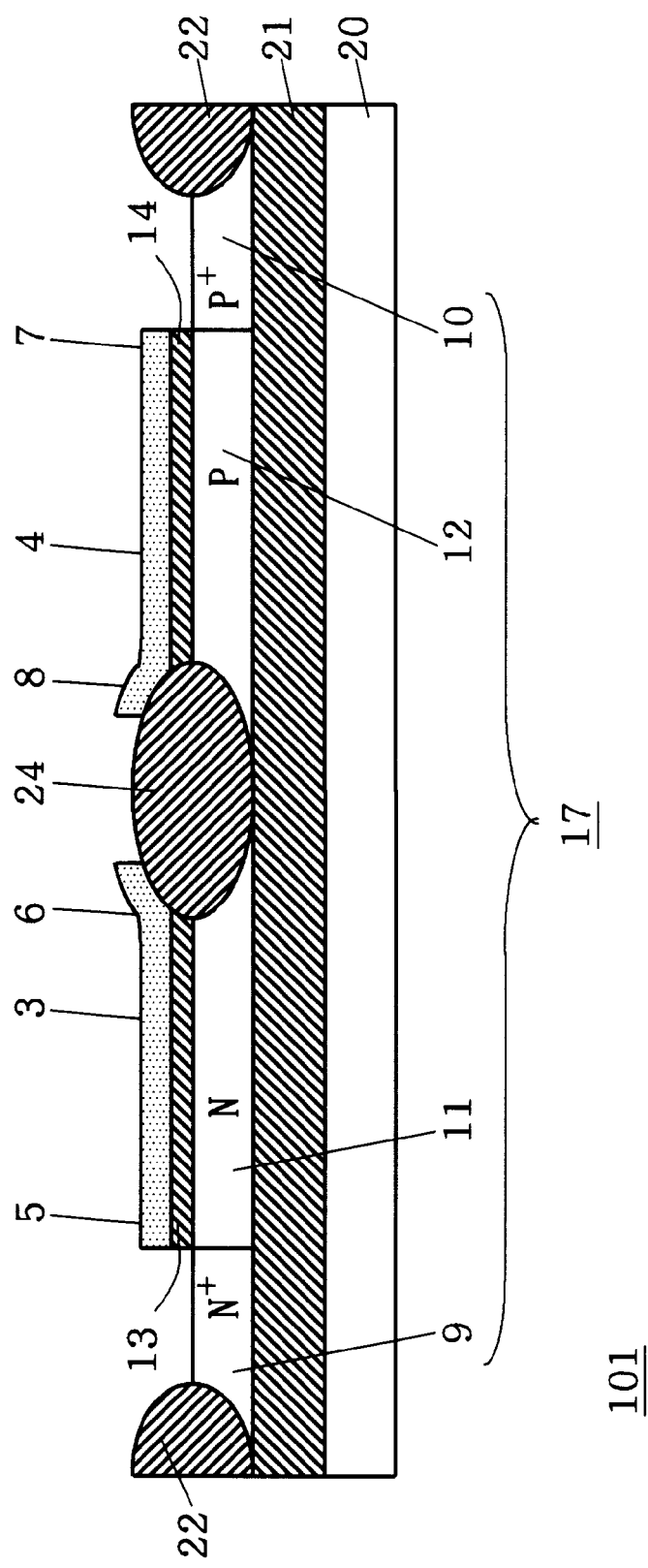
FIG. 5 is a sectional view taken along a broken line D—D in FIG. 1.

Having the same conductivity type, the body contact region 9 and the body region 11 are integrally linked to each other. Being a semiconductor region for linking the body region with the wiring pattern which will be described later, the body contact region 9 has preferably a higher impurity concentration than the body region 11 as shown in FIG. 5. For the same reason, the width of the body contact region 9 along the symmetric axis SA is set to be larger than the width of the body region 11. Further, the body contact region 9 is positioned outside the gate contact region 5 viewed from the gate electrode 3.

While the structure of the PMOS region RP has been described, as described above, the NMOS and PMOS regions RN and RP are symmetrical to each other, with respect to the symmetric axis SA. Namely, in the SOI layer 17 of the NMOS region RN, a source/drain region 2 of an $N^+$ conductivity type, a body region 12 of a P conductivity type, and a body contact region 10 of a $P^+$ conductivity type are selectively formed corresponding to the source/drain region 1, the body region 11, and the body contact region 9, respectively.

A gate insulating film 14 corresponding to the gate insulating film 13, a gate electrode 4 corresponding to the gate electrode 3, and gate contact regions 7 and 8 corresponding to the gate contact regions 5 and 6, are further formed. The body regions 11 and 12 are linked to the body contact regions 9 and 10, respectively, at their far ends from the symmetric axis SA.

As shown in FIGS. 2 to 5, the whole of the PMOS and NMOS regions RP and RN is surrounded by an isolation insulating film 22, so that the regions RP and RN are electrically insulated from the other regions in the SOI layer 17, for example, from the other PMOS and NMOS regions RP and RN formed similarly in the other regions. Further, as shown in FIG. 5, the PMOS and NMOS regions RP and RN are electrically insulated by an isolation insulating film 24 from each other.

Figure 4:
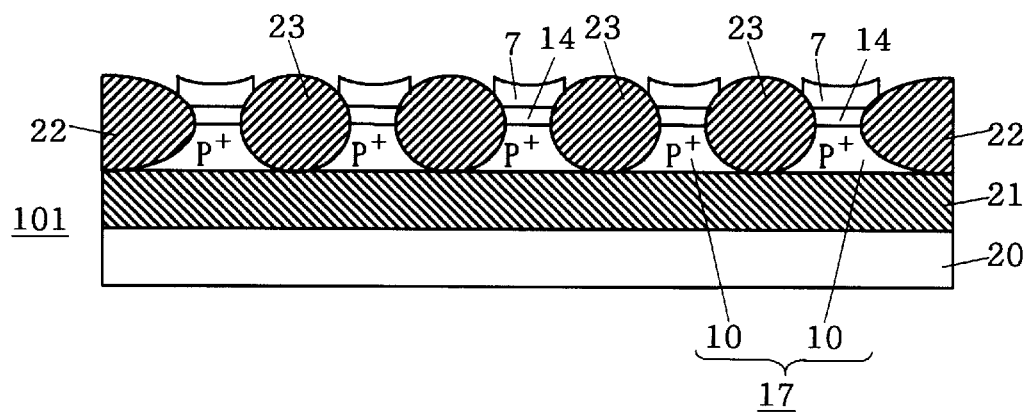
FIG. 4 is a sectional view taken along a broken line C—C in FIG. 1.

Further, as shown in FIG. 4, the isolation insulating films 23 electrically insulate the gate contact regions 7 (or 5) from one another. The isolation insulating films 23 further insulate the body contact regions 10 (or 9) from one another. Although not shown in the figures, the isolation insulating films 23 also electrically insulate the gate contact regions 8 (or 6) from one another. These isolation insulating films 22 to 24 are exposed at their upper portions to the upper major surface of the SOI layer 17, and at their bottom portions reach the upper major surface of the insulating layer 21. Thus, each one of the isolation insulating films 22 to 24 electrically insulates portions of the SOI layer 17 divided on both sides of the each one, from each other.

When the SOI layer 17 consists of a semiconductor device using silicon for the base member, the isolation insulating films 22 to 24 consist of, for example, silicon oxides (in this case, the films are called isolation oxide films). The gate electrodes 3 and 4, and the gate contact regions 5 to 8 consist of, for example, polycrystalline semiconductor devices (for example, polysilicon) doped with impurities. In this case, the conductivity types of the doped impurities need not be symmetrical between the gate electrodes 3 and 4, and between the gate contact regions 5, 6 and 7, 8.

The device 101 having such a structure forms a gate array with the basic cells BC including a pair of gate electrodes and the like arranged along the symmetric axis SA at regular intervals as shown in FIG. 1. Namely, the symmetric axis SA even indicates the direction of the arrangement of the basic cells BC. Each of the basic cells BC includes one PMOS transistor and one NMOS transistor which are symmetrical to each other in geometrical arrangement and conductivity type. As an alternative to define a complementary pair of transistors as the basic cell as shown in FIG. 1, each of the NMOS and PMOS transistors may be defined as the basic cell BC.

If a region occupied by one basic cell BC is defined as a cell region, the device 101 is provided with a row of cell regions arranged along the major surface of the SOI layer 17. In each cell region of the row, the semiconductor regions each constituting a MOS transistor, the gate electrode, and other components are formed in or on the SOI layer 17. This forms a gate array structure.

The source/drain regions 1 (or 2) on both sides of the gate electrode 3 (or 4) in one basic cell BC, function as the source and the drain, respectively. Depending on the height of the voltage applied to the gate electrode 3 (or 4), an inversion layer appears or disappears in the vicinity of the exposed surface of the body region 11 (or 12), by which continuity between the source and drain is made or cut off. In this fashion, an area in the vicinity of the exposed surface of the body region 11 (or 12) functions as a channel region.

The source/drain regions 1 between the adjacent basic cells are integrally contiguous with each other without the intervention of the insulating layer. Similarly, the source/drain regions 2 therebetween are integrally connected with each other. Thus, coupled with positional relation between the body contact region 9 (or 10) and the gate contact region 5 (or 7), a gate isolation can be implemented as will be described later. This achieves a high-density basic cell BC.

The gate contact region 5 has to be formed to cover the exposed surface of the body region 11 formed right thereunder. In the device 101, however, the body region 11 formed right under the gate contact region 5 has the same width as the body region 11 formed right under the gate electrode 3.

Thus, the gate contact regions 5 and 6 only have to have widths enough to implement an interconnection. As a result, the device 101 allows the basic cell BC to have a narrow width along the symmetric axis SA (direction of the cell arrangement), and further allows the gate contact regions 5 and 6 to secure a necessary gap W therebetween. The same also applies to the gate contact regions 7 and 8. This achieves a high-density basic cell BC.

1-2. Device After Completion of Slice step

Figure 6:
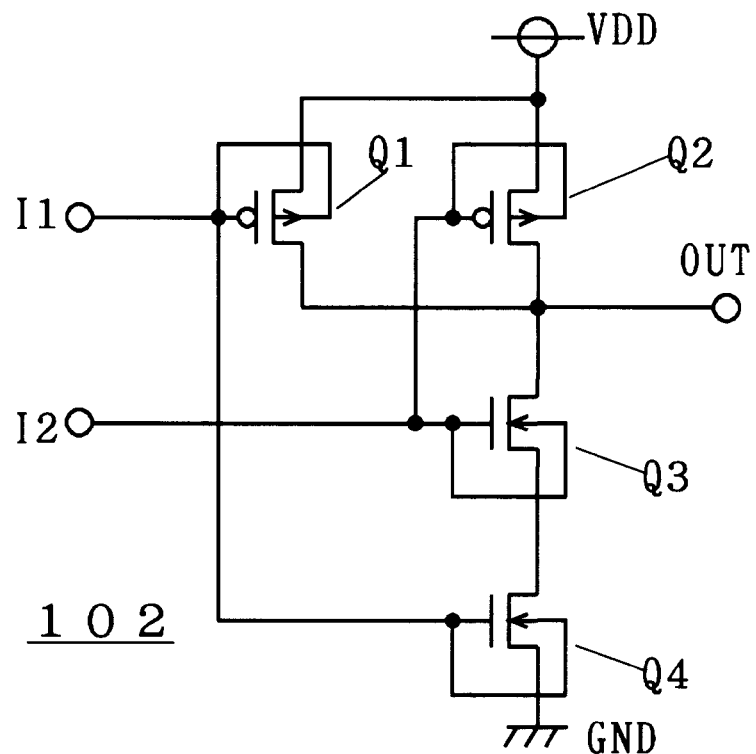
FIG. 6 is a circuit diagram of the device after the completion of a slice step according to the first preferred embodiment.

Next, we will describe an example of a semiconductor device finally formed as an integrated circuit through the slice step executed on the device 101. FIG. 6 is a circuit diagram showing a structure of the semiconductor device. This device 102 is constituted as a CMOS type two-input NAND circuit. More specifically, an invert logical product (NAND) of an input signal I1 commonly inputted into the gate electrodes of complementary transistors Q1 and Q4 and an input signal I2 commonly inputted into the gate electrodes of complementary transistors Q2 and Q3, is outputted as an output signal OUT. Respective main electrodes (generic term for drain and source electrodes) of the transistors Q1 to Q4 are connected to either of wires each supplying a source voltage VDD or GND.

Figure 7:
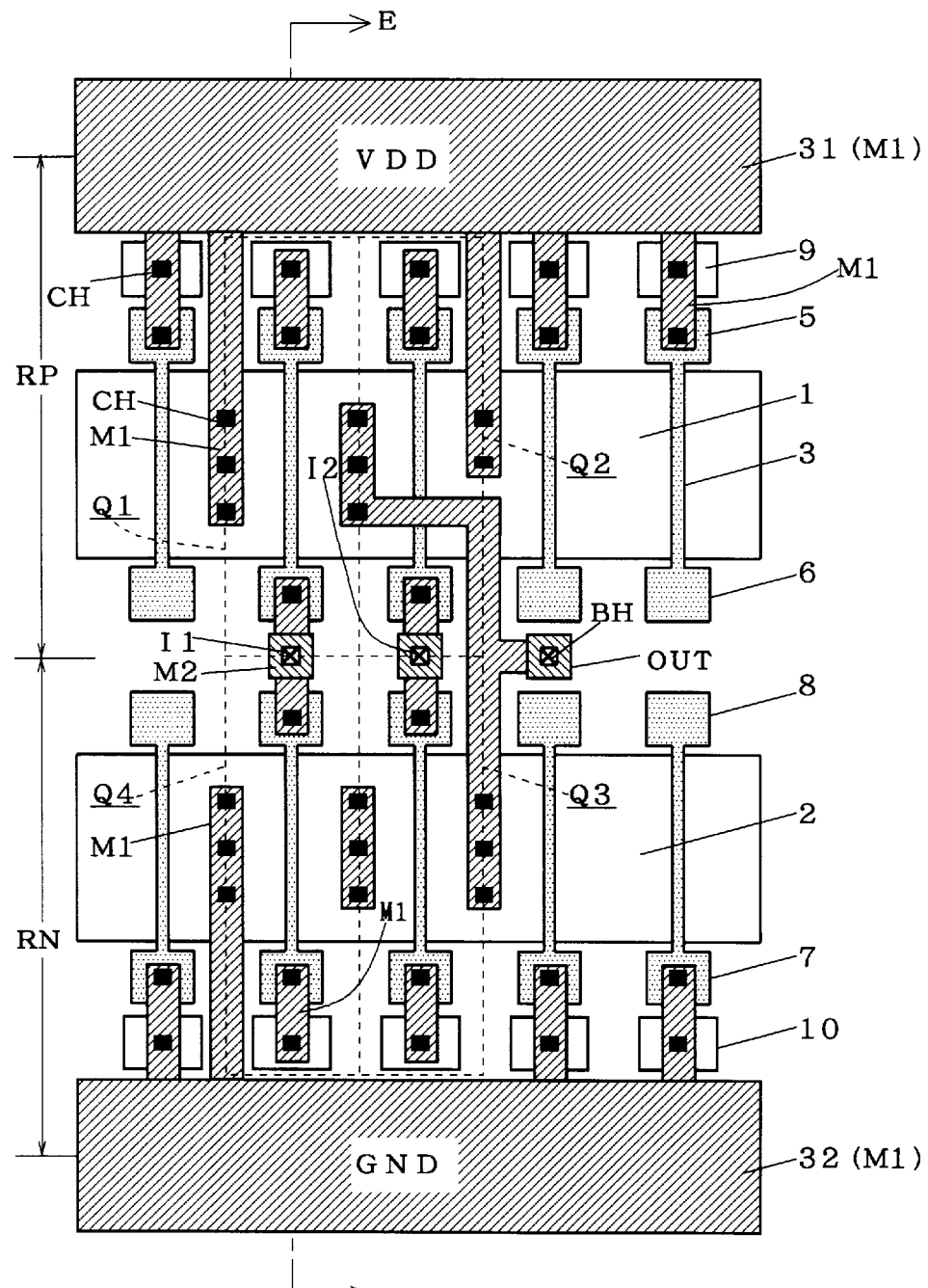
FIG. 7 is a plan view showing the device after the completion of the slice step according to the first preferred embodiment.
Figure 8:
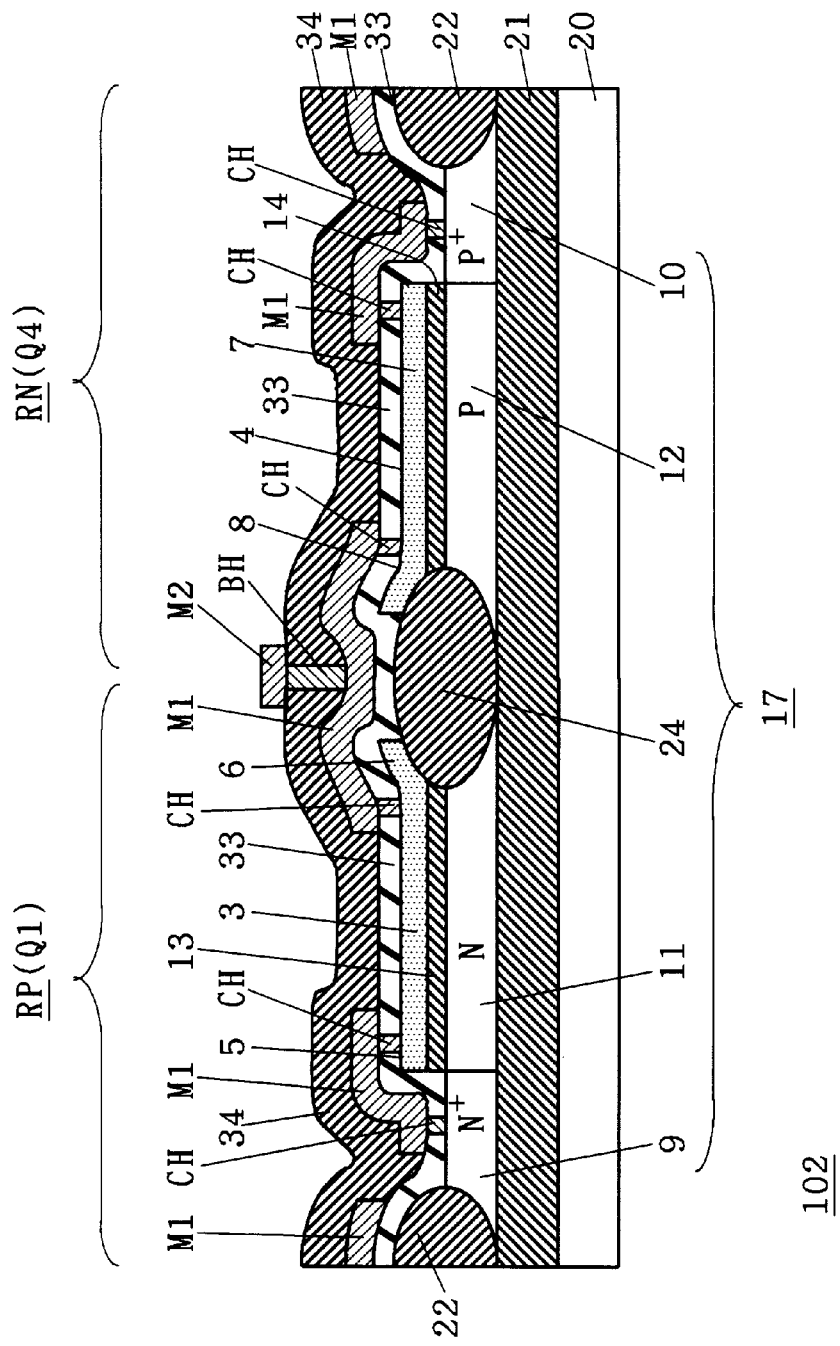
FIG. 8 is a sectional view taken along a broken line E—E in FIG. 7.

FIG. 7 is a plan view of the semiconductor device with the integrated circuit shown in FIG. 6 formed through the slice step executed on the device 101. Further, FIG. 8 is a sectional view taken along a broken line E—E in FIG. 7. On the basic cell formed through the master step, a first insulating layer 33, a first wiring pattern M1, a second insulating layer 34, and a second wiring pattern M2, are progressively formed. For example, the insulating layers 33 and 34 consist of silicon oxides, and the wiring patterns M1 and M2 consist of metals using aluminum for the base metal.

In the insulating layer 33, a contact hole CH with a conductor such as a metal buried therein is appropriately formed to connect the wiring pattern M1 arranged on the insulating layer 33 and, for example, the SOI layer 17 or the gate contact region 5 right under the insulating layer 33. Similarly, in the insulating layer 34, a via hole BH with a conductor such as a metal buried therein is formed to connect the wiring patterns M1 and M2.

In FIG. 7, for convenience in drawing, the insulating layers 33 and 34 are not shown, and the wiring patterns M1 and M2, the contact hole CH, and the via hole BH are shown with prescribed hatching. The four kinds of hatching will be commonly used in the following other plan views. The wiring patterns M1 and M2, the contact hole CH, and the via hole BH are appropriately formed depending on the circuit type to be achieved. Thus, various kinds of customized circuits can be achieved with the common device 101.

On the device 101, a source wiring 31 for supplying a positive source potential VDD and a source wiring 32 for supplying a negative source potential GND (on the ground side) are provided adjacent to the outer perimeters of the PMOS and NMOS regions, respectively, along the direction of the arrangement of the basic cells. The source wiring 31 and 32, each consisting of the wiring pattern M1, are arranged above the isolation insulating films 22.

In the device 102, as shown in FIG. 7, two adjacent basic cells form the transistors Q1 to Q4 shown in FIG. 6. More specifically, the wiring pattern M1 are connected to the respective gate contact regions 6 and 8 of the transistors Q1 and Q4 through the contact hole CH, and the wiring pattern M1 is further connected to the wiring pattern M2 through the via hole BH. From this wiring pattern M2, the input signal I1 is commonly provided to the respective gate electrodes 3 and 4 of the transistors Q1 and Q4. Similarly, the input signal I2 is commonly provided with the respective gate electrodes 3 and 4 of the transistors Q2 and Q3.

One sides of the respective source/drain regions 1 of the transistors Q1 and Q2 are connected to the wiring pattern M1 linked to the source wiring 31, through the contact hole CH. Further, one side of the source/drain region 2 of the transistor Q4 is connected to the wiring pattern M1 linked to the source wiring 32, through the contact hole CH. Furthermore, the other sides of the respective source/drain regions 1 of the transistors Q1 and Q2 are connected to one side of the source/drain regions 2 of the transistor Q3 through the contact hole CH and the wiring pattern M1. The wiring pattern M1 is further connected to the wiring pattern M2 through the via hole BH. The output signal OUT is outputted through this wiring pattern M2.

In the transistors Q1 and Q2, the body contact regions 9 are connected to the gate contact regions 5 through the contact hole CH and the wiring pattern M1. Similarly, the body contact regions 10 in the transistors Q3 and Q4 are connected to the gate contact regions 7. Namely, the transistors Q1 to Q4 are constituted as body control type MOS transistors, as shown in the circuit diagram of FIG. 6. This is made possible because the respective body contact regions 9 (or 10) of the MOS transistors are isolated from each other by the isolation insulating films 22 (in FIG. 4).

Further, in MOS transistors adjacent to the transistors Q1 and Q2, i.e., in transistors sandwiching the transistors Q1 and Q2, both the gate contact regions 5 and the body contact regions 9 are connected to the source wiring 31 through the contact hole CH and the wiring pattern M1. Similarly, in MOS transistors adjacent to the transistors Q3 and Q4, i.e., in transistors sandwiching the transistors Q3 and Q4, both the gate contact regions 7 and the body contact regions 10 are connected to the source wiring 32 through the contact hole CH and the wiring pattern M1.

In this fashion, the MOS transistors sandwiching the transistors Q1 to Q4 are held in a cutoff state. Thus, a region forming the transistors Q1 to Q4 is electrically insulated from the other region, for example, forming the other circuit. Namely, the gate isolation allows the region forming the transistors Q1 to Q4 to be electrically insulated from the other region.

Since the body contact region 9 (or 10) is formed outside the gate contact region 5 (or 7) viewed from the gate electrode 3 (or 4), the body contact region 9 (or 10) can be connected to either of the gate contact region 5 (or 7) or the source wiring 31 (or 32). This allows flexible selection between the body control type MOS transistor or the MOS transistor for the gate isolation. The achievement of the gate isolation avoids the necessity of forming the isolation insulating film for achieving electrical insulation, between the adjacent MOS transistors, thereby achieving a high-density basic cell. In other words, this achieves downsizing of the device 101.

2. Second Preferred Embodiment

In the device 102 illustrated in FIG. 7, since the body contact region 9 is connected to the gate contact region 5, parasitic resistance occurs across the gate contact region 6, to which the input signal I1 is inputted, and the body contact region 9. Further, since the body region 11 is connected to the gate electrode 3 only through the body contact region 9 connected thereto at its one end, parasitic resistance also occurs between the other end of the body region 11 and the gate electrode 3.

Figure 9:
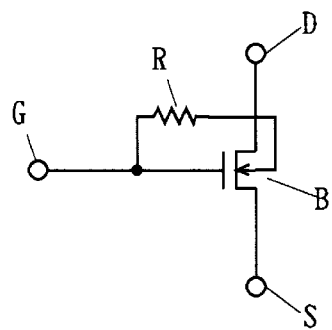
FIG. 9 is a circuit diagram illustrating the background of a device according to a second preferred embodiment.

Similarly, parasitic resistance occurs between the body contact region 10 and the gate contact region 8, and between one end of the body region 12, to which the body contact region 10 is not connected, and the gate electrode 4. The parasitic resistance is indicated by a resistance element R in a circuit diagram of FIG. 9. FIG. 9 illustrates the NMOS transistor.

Since a gate electrode G and a body region B is connected to each other via the resistance element R, if the input signal I1 inputted into the gate electrode G is high in frequency, the potential of the input signal I1 is hardly transmitted to the body region B. In second and third preferred embodiments, a device achieves a MOS transistor capable of high-speed operation while resolving or relieving such a problem.

Figure 10:
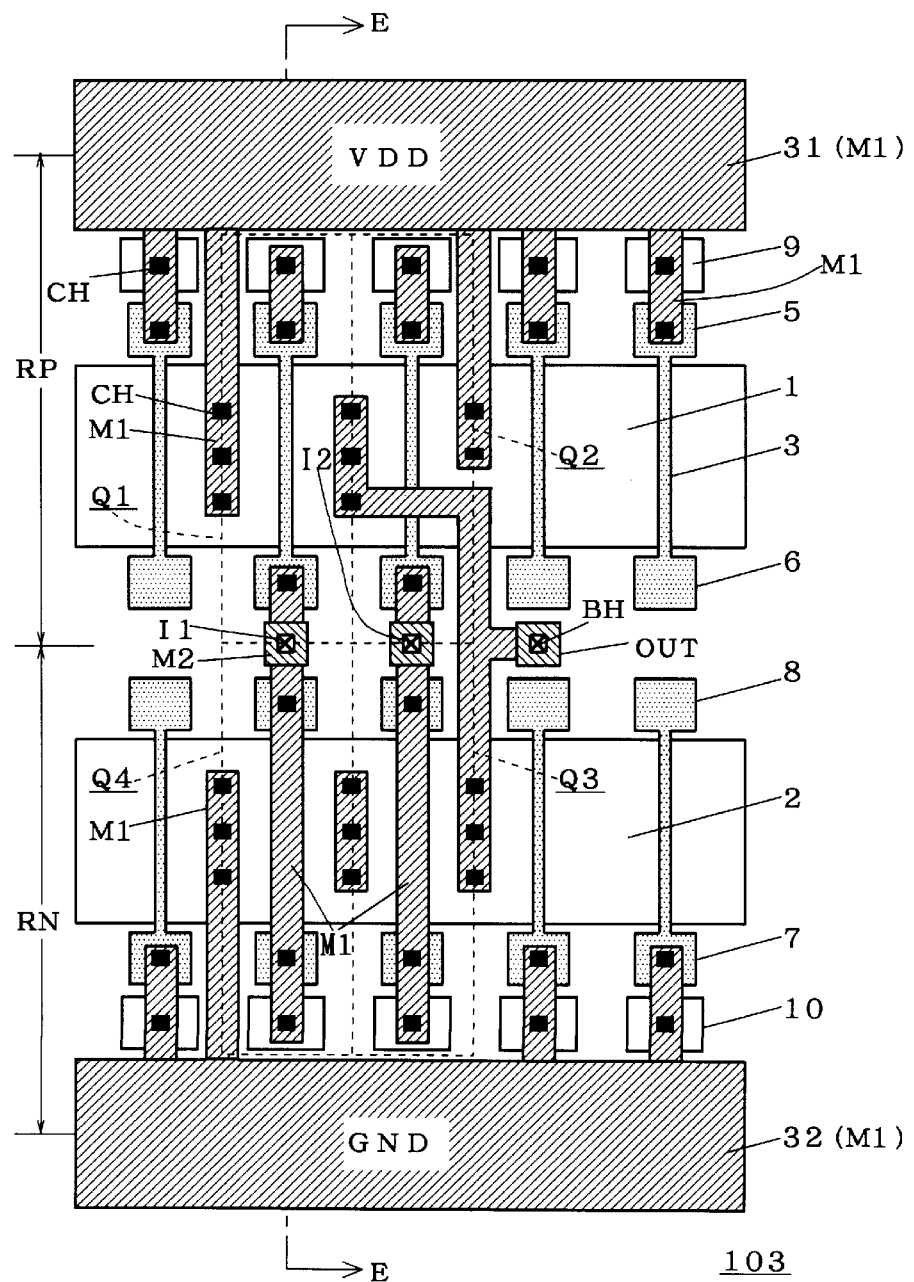
FIG. 10 is a plan view showing the device according to the second preferred embodiment.

FIG. 10 is a plan view showing a semiconductor device according to the second preferred embodiment. This device 103 is formed through the slice step. The device 103 is the same as the device 102 in achieving the circuit shown in FIG. 6, but different in that in each of the transistors Q3 and Q4, a pair of gate contact regions 7 and 8 are connected to each other not only through the gate electrode 4 but also through the contact hole CH and the wiring pattern M1.

When the gate electrode 3 (or 4) consists of polysilicon, the resistance thereof is about 8 Ω even if suppressed by using a silicide technique. On the other hand, when the wiring pattern M1 is made of Al—Si—Cu, for example, the resistance across the gate contact regions 7 and 8 connected with the wiring pattern M1 is sharply reduced to about 50 mΩ.

Namely, in the transistors Q3 and Q4, the parasitic resistance across the gate contact regions 7 and 8 are sharply reduced, which thereby reduces the resistance element R shown in FIG. 9. This improves the operating speed of the transistors Q3 and Q4, and further improves the operating speed of the whole circuit including the transistors Q1 and Q2.

Figure 11:
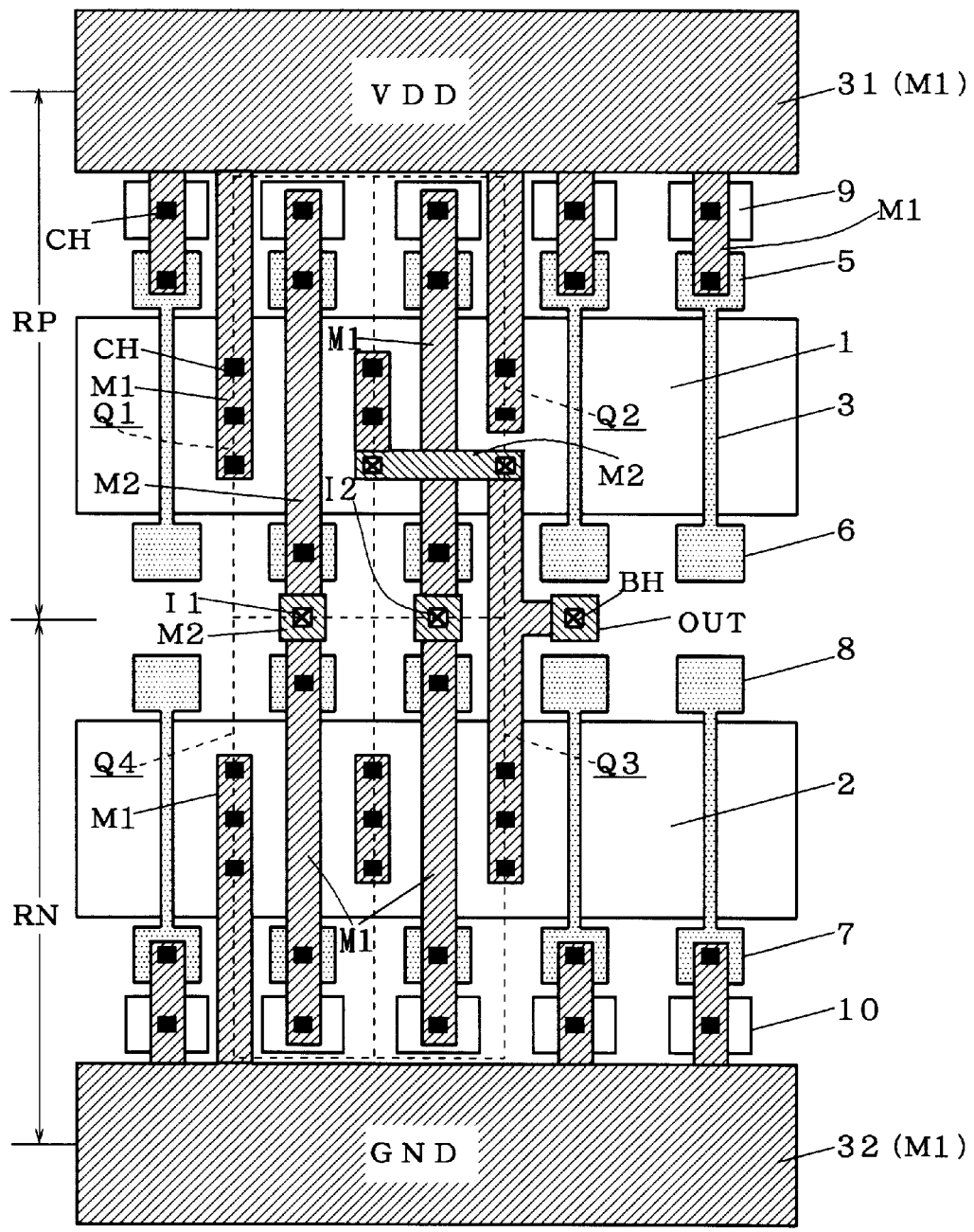
FIG. 11 is a plan view showing another example of the device according to the second preferred embodiment.
Figure 12:
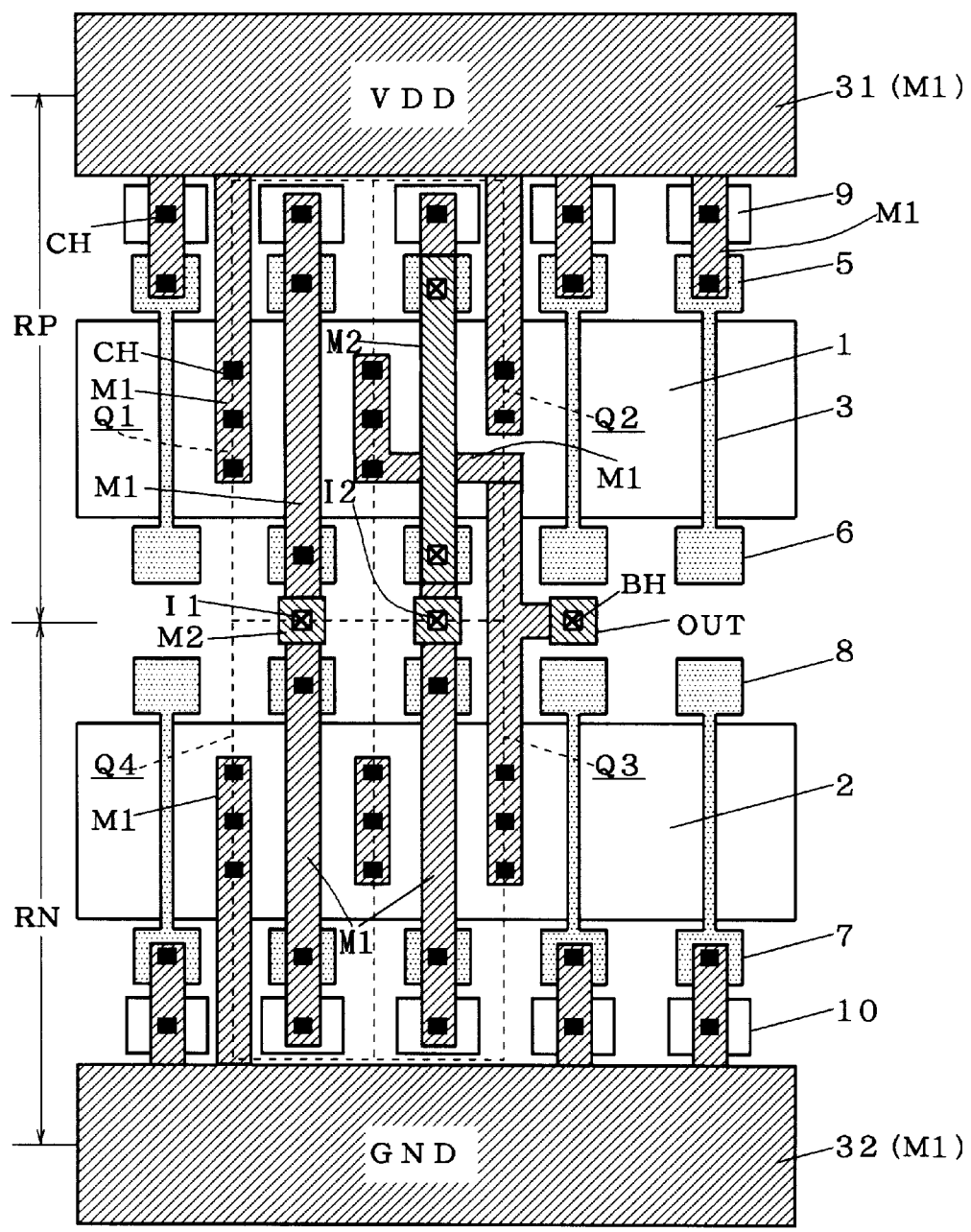
FIG. 12 is a plan view showing still another example of the device according to the second preferred embodiment.

FIGS. 11 and 12 are plan views showing devices constituted to improve the operating speed of the transistors Q1 and Q2 as well. In each of the transistors Q1 and Q2 in a device 104 shown in FIG. 11, like the transistors Q3 and Q4 in the device 103, the gate contact regions 5 and 6 are connected to each other through the contact hole CH and the wiring pattern M1.

The wiring pattern M1 for transmitting the output signal OUT from the source/drain regions 1 of the transistors Q1 and Q2 is partly replaced by the wiring pattern M2 connected by the via hole BH. This allows three-dimensional intersection of the wiring pattern M1 connecting the gate contact regions 5, 6 of the transistor Q2 and the wiring pattern for transmitting the output signal OUT, without short.

In a device 105 shown in FIG. 12, while a wiring pattern for transmitting the output signal OUT consists of the wiring pattern M1 as in the device 103, a wiring pattern for connecting the gate contact regions 5 and 6 of the transistor Q2 consists of the wiring pattern M2. This allows three-dimensional intersection of those wiring patterns as in the device 104.

In this fashion, a proper use of the wiring patterns M1 and M2 makes it possible to connect a pair of gate contact regions of any desired transistor out of the transistors forming a circuit. This improves the operating speed of the circuit.

3. Third Preferred Embodiment

Figure 13:
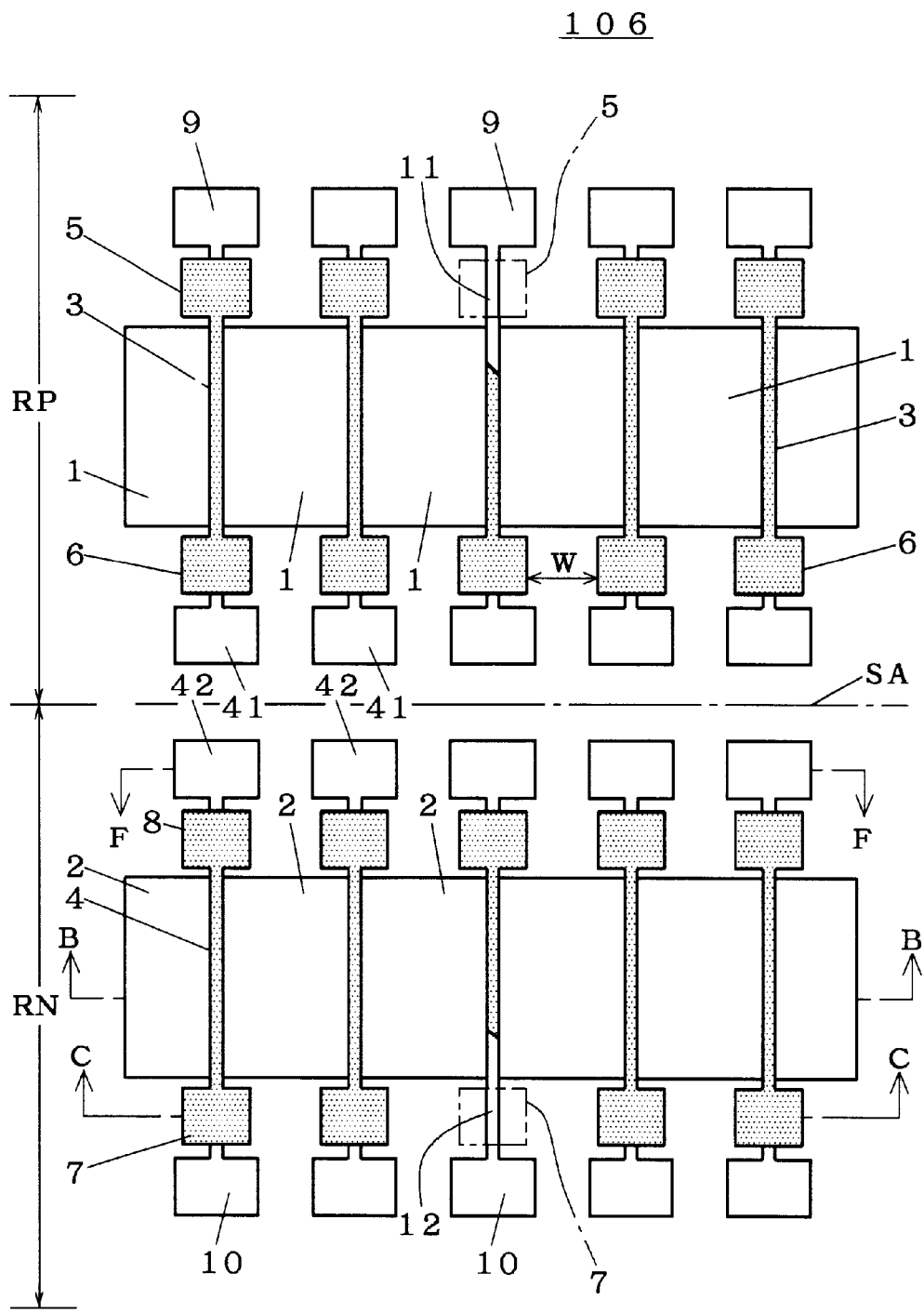
FIG. 13 is a plan view showing a device after the completion of the master step according to a third preferred embodiment.

FIG. 13 is a plan view of a semiconductor device according to a third preferred embodiment. This device 106 corresponds to a semiconductor device formed halfway toward completion through the master step. In the device 106, the body region 11 is further linked to another body contact region 41 at its one end which is not linked to the body contact region 9. Similarly, the body region 12 is further linked to another body contact region 42 at its one end which is not linked to the body contact region 10. The device 106 differs characteristically on this point from the device 1 in FIG. 1.

The body contact region 41 is constituted similar to the body contact region 9. Namely, the body contact region 41 is selectively formed in the SOI layer 17, being exposed at its upper surface to the upper major surface of the SOI layer 17 and at its bottom surface reaching the upper major surface of the insulating layer 21. Further, having the same conductivity type, the body contact 41 and the body region 11 are integrally linked to each other.

Being a semiconductor region for linking the body region 11 to the wiring pattern, the body contact region 41 has preferably a higher impurity concentration than the body region 11. For the same reason, the width of the body contact region 41 along the symmetric axis SA is set to be larger than the width of the body region 11. Further, the body contact region 41 is formed outside the gate contact region 6, viewed from the gate electrode 3. The body contact region 42 is constituted similar to the body contact region 41 described above.

FIG. 4 is a sectional view taken along a broken line F—F in FIG. 13, only with the body contact region 10 and the gate contact region 7 substituted by the body contact region 42 and the gate contact region 8, respectively. Thus, the adjacent body contact regions 42 are electrically insulated from each other by the isolation insulating film 23. The same applies to the body contact region 41.

In the device 106, providing the body contact regions 41 and 42 allows the connection of the body contact region 41 and the gate contact region 6, and the connection of the body contact region 42 and the gate contact region 8. This reduces the parasitic resistance element R in the device 106 as compared with the device 101.

In the device 106, to be connected to the body contact region 41, the body region 11 has to be extended right under the gate contact region 6. In the device 106, however, the body region 11 formed right under the gate contact region 6 has the same width as the body region 11 formed right under the gate electrode 3. Thus, the gate contact region 6 only has to have a width enough to be a link.

As a result, like the device 101, the device 106 allows the basic cell BC to have a narrow width along the symmetric axis SA (direction of the cell arrangement), and further allows the gate contact regions 6 to secure a necessary gap W therebetween. The same also applies to the gate contact regions 8. This achieves a high-density basic cells BC.

Figure 14:
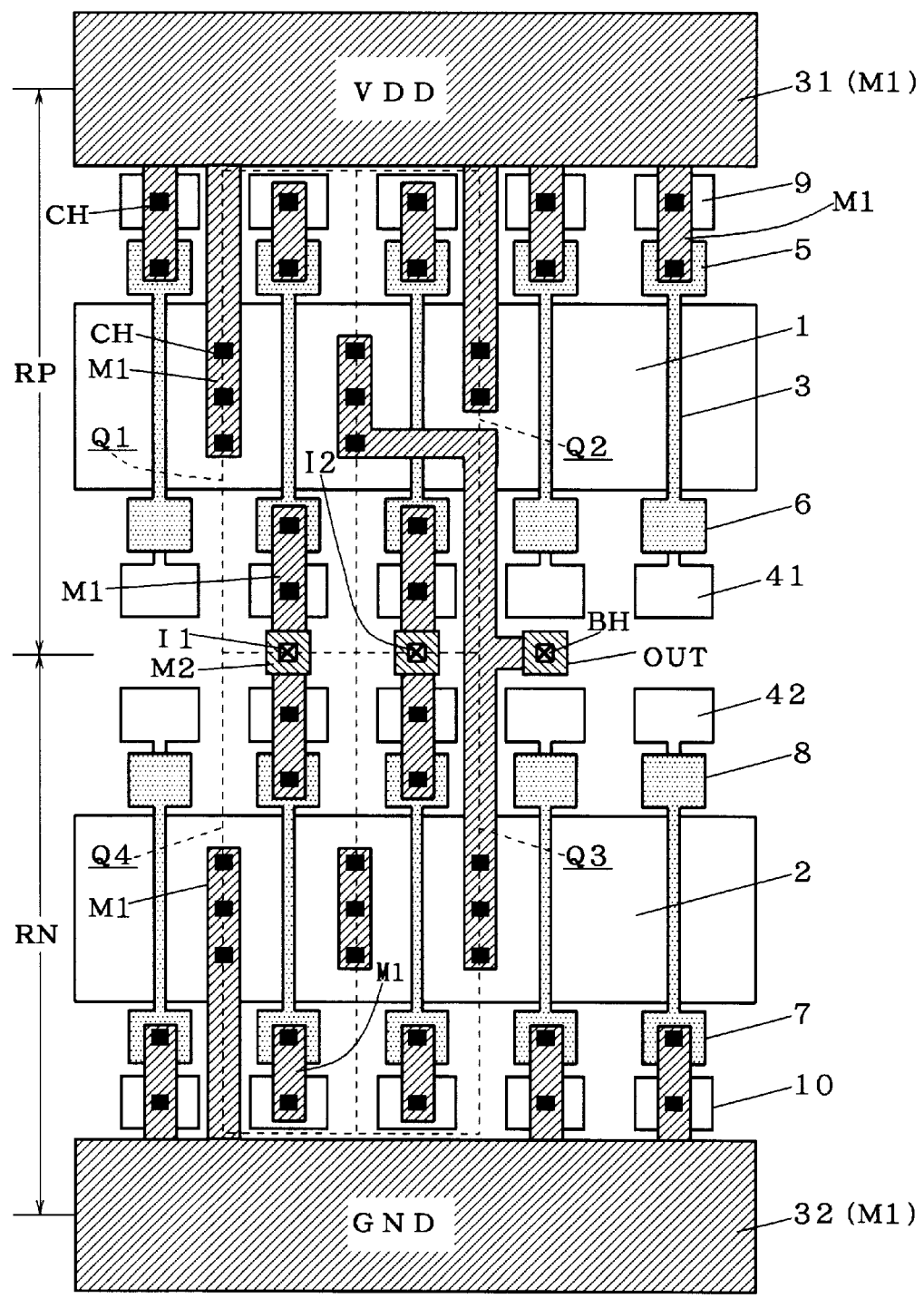
FIG. 14 is a plan view showing a device after the completion of the slice step according to the third preferred embodiment.

FIG. 14 is a plan view of a semiconductor device achieving the integrated circuit of FIG. 6 by the execution of the slice step on the device 106. In each of the transistors Q1 and Q2 in this device 107, the gate contact region 6 and the body contact region 41 are connected to each other through the contact hole CH and the wiring pattern M1. Similarly, in each of the transistors Q3 and Q4, the gate contact region 8 and the body contact region 42 are connected to each other through the contact hole CH and the wiring pattern M1. The device 107 differs characteristically on this point from the device 102.

Since the body region 11 is connected at its both ends to the gate contact regions 5 and 6 through the body contact regions 9 and 41, the parasitic resistance across the gate contact region 6 to which the input signals I1 and I2 are inputted, and the whole body region 11 is reduced about by half This reduces the resistance element R shown in FIG. 9, thereby improving the operating speed of the transistors Q1 and Q2. Similarly, since the body region 12 is connected at its both ends to the gate contact regions 7 and 8 through the body contact regions 10 and 42, the operating speed of the transistors Q3 and Q4 is improved as well.

FIG. 14 shows the case where, in the MOS transistor for gate isolation, the gate contact region 6 (or 8) and the body contact region 41 (or 42) are not connected to each other through the wiring pattern. This, however, offers no problem because, in such a transistor, the potential of the body region 11 (or 12) is fixed to a certain source potential VDD (or GND).

4. Fourth Preferred Embodiment

Figure 15:
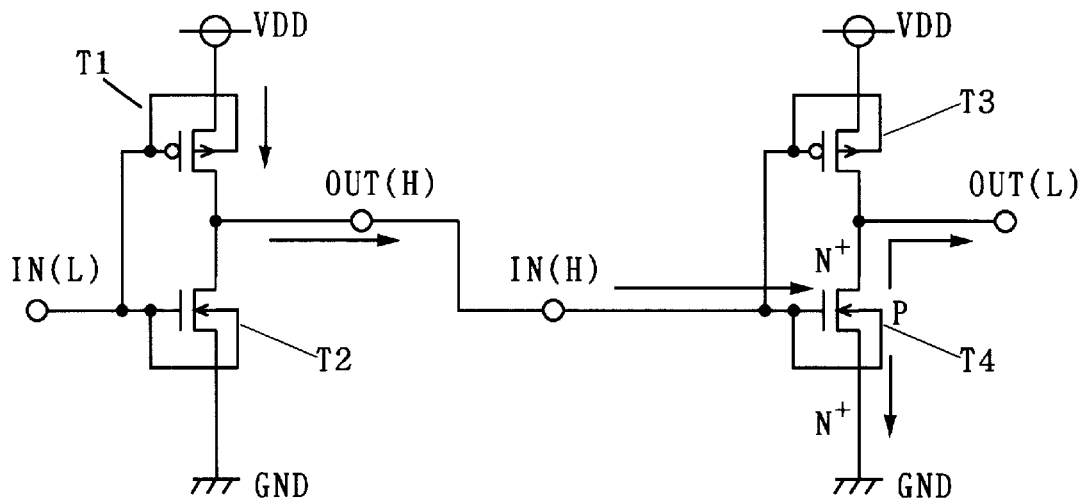
FIG. 15 is a circuit diagram illustrating the background of a device according to a fourth preferred embodiment.

Before describing a device according to a fourth preferred embodiment, we will first describe background problems. FIG. 15 shows a circuit consisting of the body control type MOS transistor with the gate electrode connected to the body region. This circuit comprises two inverters connected in cascade. We will now describe operation of this device, for example, with a voltage between the source potentials VDD and GND, or a source voltage, set at 0.5 V.

When an input signal IN of an ante-stage inverter is low in level (0 V), its output signal OUT, or an input signal IN of a post-stage inverter, becomes high in level (0.5 V). As a result, the output signal OUT of the post-stage inverter becomes low in level.

In PMOS transistors T1 and T3 out of transistors T1 to T4 included in the circuit in FIG. 15, the body region (N type) and the source/drain region ($P^+$ type) form a diode. Similarly, in NMOS transistors T2 and T4, the body region (P type) and the source/drain region ($N^+$ type) form a diode. In general, an ON-state voltage of silicon diode (forward voltage) is about 0.8 V, and the application of about 0.5 V forward voltage causes a leakage current to slightly flow in the forward direction.

When the output signal OUT of the post-stage inverter is low in level, about 0.5-V forward voltage is applied to the diode formed of the body region (P type) and the source/drain region ($N^+$ type) in the transistor T4. As a result, the leakage current flows across this diode along the path indicated by arrows in FIG. 15. Especially for a large-scale integrated circuit, this leakage current will be a factor that increases power consumption in a standby state.

Figure 16:
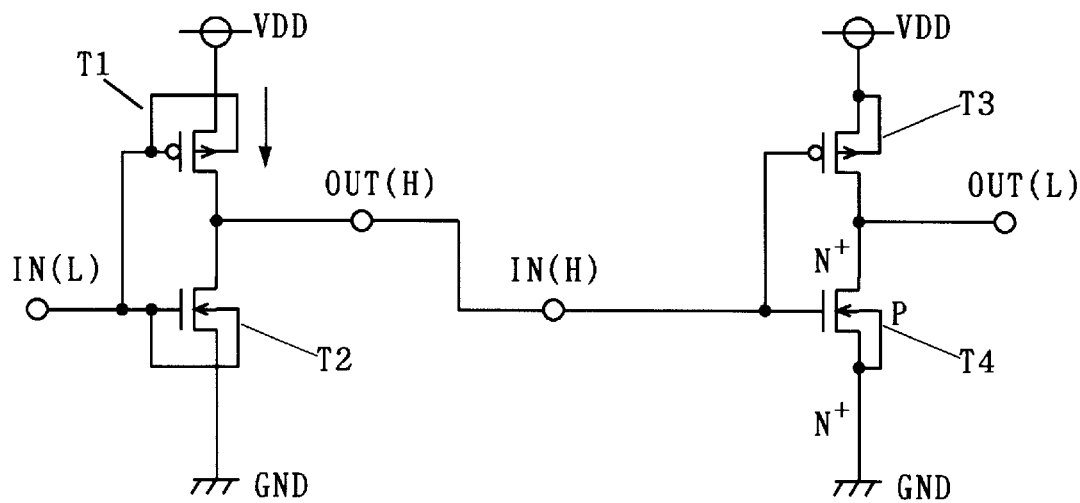
FIG. 16 is a circuit diagram showing the device according to the fourth preferred embodiment.

In the fourth preferred embodiment, we will describe a semiconductor device constituted to reduce the current consumption in a standby state, i.e., a standby current. FIG. 16 is a circuit diagram showing a semiconductor device according to the fourth preferred embodiment. Like the circuit in FIG. 15, this circuit also comprises two-stage inverters and has the same logic operation function.

In the circuit in FIG. 16, however, while the transistors T1 and T2 belonging to the ante-stage inverter are constituted as the body control type MOS transistors with the gate electrode connected to the body region, the transistors T3 and T4 belonging to the post-stage inverter are constituted as body fixed type MOS transistors with the body region connected to the source/drain region. This resolves the flow of leakage current into the transistors T3 and T4, thereby saving the standby current in the whole circuit in FIG. 16.

As described above, the standby current can be reduced by mixing the body control type transistors and the body fixed type transistors to constitute a circuit with a plurality of MOS transistors. On the other hand, the body control type transistor has an advantage in improving the operating speed as compared with the body fixed type transistor.

Thus, preferably, the body control type transistor is arranged only at a portion having a large capacitive load or at a path (critical path) requiring high-speed operation, while the body fixed type transistor is arranged at the other portions. This achieves a circuit that suppresses deterioration in operating speed and saves the standby current as compared with the circuit consisting only of the body control type transistors. On the other hand, for an integrated circuit that put emphasis not on the operating speed but only on the saving of standby current, all transistors may be of the body fixed type.

The devices 101 and 106 (FIG. 1, FIG. 13) after the completion of the master step are capable of freely setting a number of MOS transistors to be of either the body control type or the body fixed type, respectively. We will describe this with an example of a semiconductor device achieving a circuit shown in FIG. 17. The circuit in FIG. 17 has the same in logical operation function as the circuit in FIG. 6, but differs in that all the transistors Q1 to Q4 are of the body fixed type.

Figure 17:
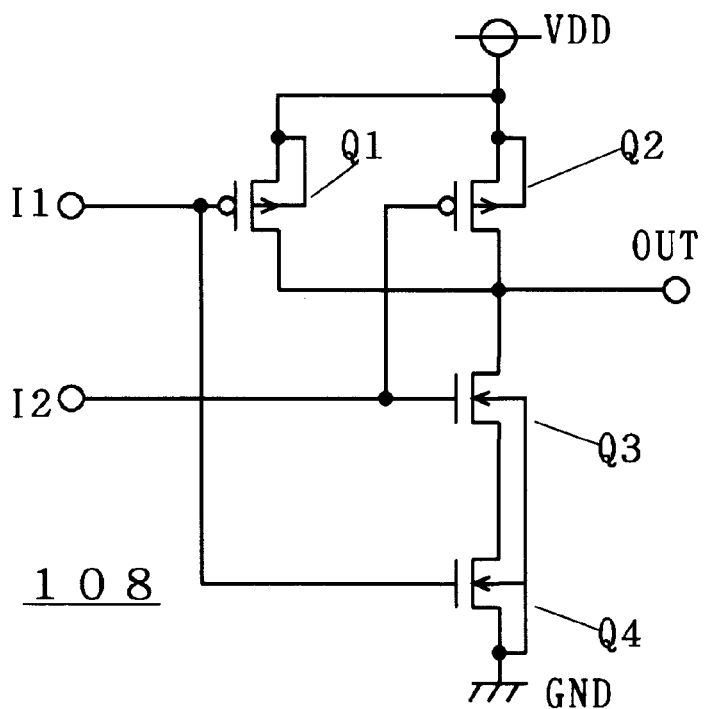
FIG. 17 is a circuit diagram showing another example of the device according to the fourth preferred embodiment.
Figure 18:
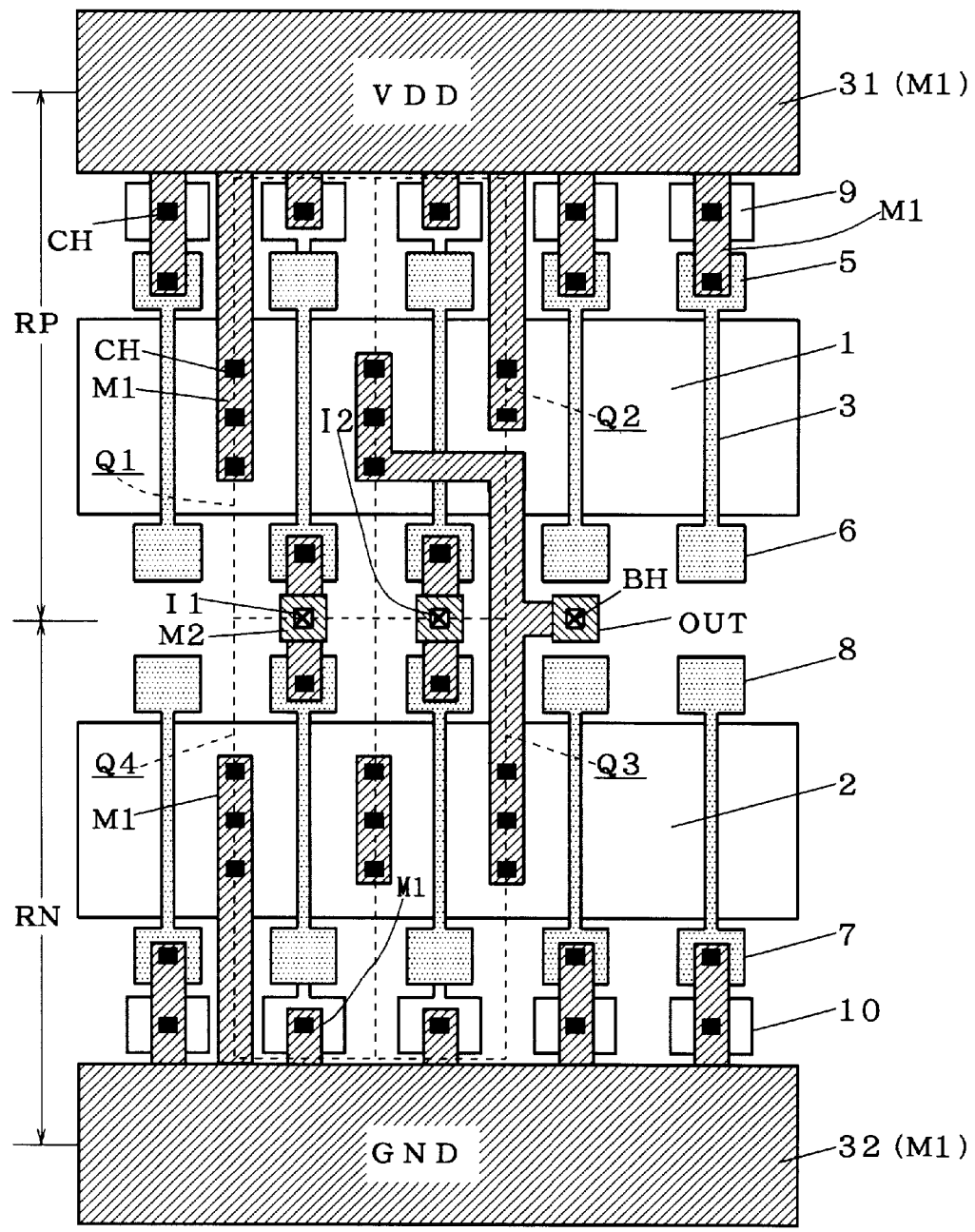
FIG. 18 is a plan view of the device shown in FIG. 7.

FIG. 18 is a plan view showing the semiconductor device achieving the circuit shown in FIG. 17 with the basic cell of the device 101. In this device 108, in each of the transistors Q1 and Q2, the body contact region 9 is connected through the contact hole CH and the wiring pattern M1 not to the gate contact region 5 but to the source wiring 31. Similarly, in each of the transistors Q3 and Q4, the body contact region 10 is connected not to the gate contact region 7 but to the source wiring 32. The device 108 differs characteristically on this point from the device 102.

Namely, while all the transistors Q1 to Q4 in the device 102 are of the body control type, all the transistors Q1 to Q4 in the device 108 are of the body fixed type. Although all the transistors Q1 to Q4 are of the same type, either the body control type or the body fixed type, in the devices 102 and 108, it is obvious from FIGS. 7 and 18 that the transistors Q1 to Q4 may be of different types.

Figure 19:
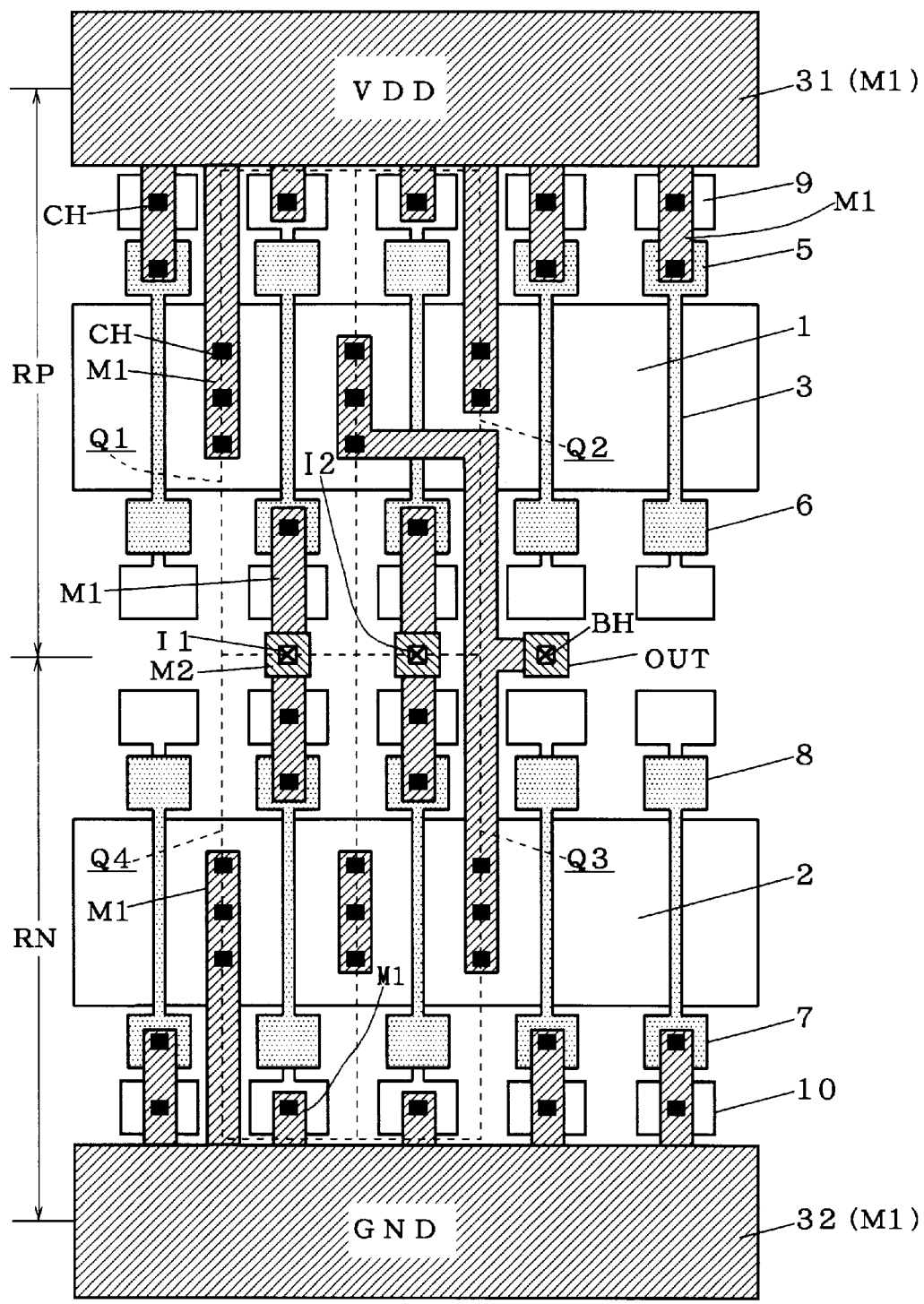
FIG. 19 is a plan view showing still another example of the device according to the fourth preferred embodiment.

FIG. 19 is a plan view showing a semiconductor device achieving the circuit in FIG. 17 with the basic cell of the device 106. In this device 109, in each of the transistors Q1 and Q2, the body contact region 9 is connected through the contact hole CH and the wiring pattern M1 not to the gate contact region 5 but to the source wiring 31. Similarly, in each of the transistors Q3 and Q4, the body contact region 10 is connected not to the gate contact region 7 but to the source wiring 32.

Further, since no contact hole CH is formed on the body contact region 41 in each of the transistors Q1 and Q2, the body contact region 41 and the gate contact region 6 are not connected to each other. Similarly, since no contact hole CH is formed on the body contact region 42 in each of the transistors Q3 and Q4, the body contact region 42 and the gate contact region 8 are not connected to each other. The device 109 differs characteristically on this point from the device 107 (FIG. 14).

In the device 109, the body contact region 41 is, differently from the body contact region 9 on the other side, not connected to the source wiring 31. This, however, would not deteriorate the operating speed because the potential of the body region 11 is fixed at the potential of the source wiring 31. The same applies to the body contact region 24.

5. Modification

While the CMOS gate array type semiconductor device including both the PMOS and NMOS transistors is described in the aforementioned preferred embodiments, as an alternative, the gate array type semiconductor device may consist of only one type of transistors.

While the invention has been described in detail, the foregoing description is in all aspects illustrative and not restrictive. It is understood that numerous other modifications and variations can be devised without departing from the scope of the invention.

We claim:

1. A semiconductor device of gate array type, comprising:

an insulating layer of electrical insulation; and a semiconductor layer formed on said insulating layer and defining a major surface on an opposite side of said insulating layer, said device defining cell regions arranged in a row along said major surface, said semiconductor layer, in each one of said cell regions, having:

a source/drain region of first conductivity type exposed to said major surface;

a body region of second conductivity type exposed to said major surface and so arranged as to divide said source/drain region into two regions which are placed side by side in a direction of said row; and a body contact region of second conductivity type exposed to said major surface and linked to an end of said body region, said device, in each one of said cell regions, further comprising:

a gate insulating film of electrical insulation formed on a portion of said major surface to which said body region is exposed;

a gate electrode of electrical conductance formed on said gate insulating film; and gate contact regions of electrical conductance formed on said gate insulating film and respectively linked to both ends of said gate electrode, said body contact region being disposed at such a position that the same and said gate electrode sandwich one of said gate contact regions therebetween, wherein said semiconductor layer further has:

an isolation insulating film which isolates said body contact region from each other between any adjacent two of said cell regions.

2. The semiconductor device of claim 1, wherein said device, further defines other cell regions arranged in an another row parallel to said row, said cell regions and said other cell regions are defined symmetrically with reference to an axis defined between and in parallel to said row and another row, said semiconductor layer, in each one of said other cell regions, further has:

another source/drain region of second conductivity type exposed to said major surface;

another body region of first conductivity type exposed to said major surface and so arranged as to divide said another source/drain region into two regions which are placed side by side in a direction of said another row; and another body contact region of first conductivity type exposed to said major surface and linked to an end of said another body region, said device, in each one of said other cell regions, further comprises:

another gate insulating film of electrical insulation formed on a portion of said major surface to which said another body region is exposed;

another gate electrode of electrical conductance formed on said another gate insulating film; and an other gate contact regions of electrical conductance formed on said another gate insulating film and respectively linked to both ends of said another gate electrode, said another body contact region is disposed at such a position that the same and said another gate electrode sandwich one of said other gate contact regions therebetween, and between any symmetrical two each selected from said cell regions and said other cell regions respectively, said source/drain region and said another source/drain region, said body region and said another body region, said contact region and said another body contact region, said gate insulating film and said another gate insulating film, said gate electrode and said another gate electrode, and, said gate contact regions and said other gate contact regions, are respectively symmetric with reference to said axis.

3. The semiconductor device of claim 2, wherein said device, in each one of at least a part of said cell regions, further comprises:

a connecting wiring which electrically connects said body contact region and said one of said gate contact regions with each other.

4. The semiconductor device of claim 3, wherein said device further comprises:

a source wiring for supplying a source potential, said cell regions include another part thereof excluding said at least a part thereof, and said device, in each one of said another part of said cell regions, further comprises:

another connecting wiring which electrically connects said body contact region and said source wiring with each other.

5. The semiconductor device of claim 2, wherein said source/drain region is integrally contiguous with each other between any adjacent two of said cell regions.

6. The semiconductor device of claim 5, wherein said device further comprises:

a source wiring for supplying a source potential, and said device, in each one of at least a part of said cell regions, further comprises:

a connecting wiring which electrically connects said source wiring, said body contact region and said one of said gate contact regions with one another.

7. A semiconductor device of gate array type, comprising:

an insulating layer of electrical insulation; and a semiconductor layer formed on said insulating layer and defining a major surface on an opposite side of said insulating layer, said device defining cell regions arranged in a row along said major surface, said semiconductor layer, in each one of said cell regions, having:

a source/drain region of first conductivity type exposed to said major surface;

a body region of second conductivity type exposed to said major surface and so arranged as to divide said source/drain region into two regions which are placed side by side in a direction of said row; and a body contact region of second conductivity type exposed to said major surface and linked to an end of said body region, said device, in each one of said cell regions, further comprising:

a gate insulating film of electrical insulation formed on a portion of said major surface to which said body region is exposed;

a gate electrode of electrical conductance formed on said gate insulating film; and gate contact regions of electrical conductance formed on said gate insulating film and respectively linked to both ends of said gate electrode, said body contact region being disposed at such a position that the same and said gate electrode sandwich one of said gate contact regions therebetween, wherein said semiconductor layer, in each one of said cell regions, further has:

another body contact region of second conductivity type exposed to said major surface and linked to another end of said body region, and said another body contact region is disposed at such a position that the same and said gate electrode sandwich another one of said gate contact regions therebetween.

8. The semiconductor device of claim 7, wherein said semiconductor layer further has:

an isolation insulating film which isolates said body contact region from each other between any adjacent two of said cell regions; and another isolation insulating film which isolates said another body contact region from each other between any adjacent two of said cell regions.

9. The semiconductor device of claim 8, wherein said device, in each one of at least a part of said cell regions, further comprises:

a connecting wiring which electrically connects said body contact region and said one of said gate contact regions with each other; and another connecting wiring which electrically connects said another body contact region and said another one of said gate contact regions with each other.

10. A semiconductor device of gate array type, comprising:

an insulating layer of electrical insulation; and a semiconductor layer formed on said insulating layer and defining a major surface on an opposite side of said insulating layer, said device defining cell regions arranged in a row along said major surface, said semiconductor layer, in each one of said cell regions, having:

a source/drain region of first conductivity type exposed to said major surface;

a body region of second conductivity type exposed to said major surface and so arranged as to divide said source/drain region into two regions which are placed side by side in a direction of said row; and a body contact region of second conductivity type exposed to said major surface and linked to an end of said body region, said device, in each one of said cell regions, further comprising:

a gate insulating film of electrical insulation formed on a portion of said major surface to which said body region is exposed;

a gate electrode of electrical conductance formed on said gate insulating film; and gate contact regions of electrical conductance formed on said gate insulating film and respectively linked to both ends of said gate electrode, said body contact region being disposed at such a position that the same and said gate electrode sandwich one of said gate contact regions therebetween, wherein said device, in each one of at least a part of said cell regions, further comprises:

a connecting wiring lower in electric resistance than said gate electrode, said connecting wiring being disposed over said gate electrode and electrically connecting said gate contact regions with each other which are respectively linked to said both ends of said gate electrode.

11. A semiconductor device of gate array type, comprising:

an insulating layer of electrical insulation; and a semiconductor layer formed on said insulating layer and defining a major surface on an opposite side of said insulating layer, said device defining cell regions arranged in a row along said major surface, said semiconductor layer, in each one of said cell regions, having:

a source/drain region of first conductivity type exposed to said major surface;

a body region of second conductivity type exposed to said major surface and so arranged as to divide said source/drain region into two regions which are placed side by side in a direction of said row; and a body contact region of second conductivity type exposed to said major surface and linked to an end of said body region, said device, in each one of said cell regions, further comprising:

a gate insulating film of electrical insulation formed on a portion of said major surface to which said body region is exposed;

a gate electrode of electrical conductance formed on said gate insulating film; and gate contact regions of electrical conductance formed on said gate insulating film and respectively linked to both ends of said gate electrode, said body contact region being disposed at such a position that the same and said gate electrode sandwich one of said gate contact regions therebetween, wherein said body region is narrower in a direction of said row in any portion thereof right under said gate electrode and said gate contact regions than said body contact region.

12. A semiconductor device of gate array type, comprising:

an insulating layer of electrical insulation; and a semiconductor layer formed on said insulating layer and defining a major surface on an opposite side of said insulating layer, said semiconductor layer having:

a source/drain region of first conductivity type exposed to said major surface;

a body region of second conductivity type exposed to said major surface and so arranged as to divide said source/drain region into two regions; and a body contact region of second conductivity type exposed to said major surface and linked to an end of said body region, said device further comprising:

a gate insulating film of electrical insulation formed on a portion of said major surface to which said body region is exposed;

a gate electrode of electrical conductance formed on said gate insulating film; and gate contact regions of electrical conductance formed on said gate insulating film and respectively linked to both ends of said gate electrode, said body contact region being disposed at such a position that the same and said gate electrode sandwich one of said gate contact regions therebetween, and said body region being narrower in a direction perpendicular to a row formed by said gate electrode, said one of said gate contact regions, and said body contact region in any portion thereof right under said gate electrode and said gate contact regions than said body contact region.

* * * * *